(12) United States Patent
Matteson et al.

(10) Patent No.: US 6,867,436 B1
(45) Date of Patent: Mar. 15, 2005

(54) TRANSIENT VOLTAGE SUPPRESSION DEVICE

(75) Inventors: Fred Matteson, Phoenix, AZ (US); Venkatesh Panemangalore Pai, Gilbert, AZ (US); Donald K. Cartmell, Phoenix, AZ (US)

(73) Assignee: Protek Devices, LP, Tempe, AZ (US)

( * ) Notice: Subject to any disclaimer, the term of this patent is extended or adjusted under 35 U.S.C. 154(b) by 0 days.

(21) Appl. No.: 10/635,088

(22) Filed: Aug. 5, 2003

(51) Int. Cl.[7] .................. H01L 29/30; H01L 29/866; H01L 29/88; H01L 29/861; H01L 31/107
(52) U.S. Cl. ................. 257/106; 257/603; 257/606
(58) Field of Search ..................... 257/106, 603, 257/604, 605, 606

(56) References Cited

U.S. PATENT DOCUMENTS

| | | | |
|---|---|---|---|
| 5,245,412 A | 9/1993 | Clark et al. | 257/601 |
| 5,416,351 A * | 5/1995 | Ito et al. | 257/357 |
| 6,369,427 B1 * | 4/2002 | Williamson | 257/355 |
| 6,392,266 B1 | 5/2002 | Robb et al. | 257/314 |
| 6,605,859 B1 * | 8/2003 | Romas et al. | 257/606 |
| 6,734,504 B1 * | 5/2004 | Lie et al. | 257/355 |

* cited by examiner

*Primary Examiner*—Ngân V. Ngô
(74) *Attorney, Agent, or Firm*—Cahill, von Hellens & Glazer P.L.C.

(57) ABSTRACT

A bi-directional transient voltage suppression ("TVS") device (101) includes a semiconductor die (201) that has a first avalanche diode (103) in series with a first rectifier diode (104) connected cathode to cathode, electrically coupled in an anti-parallel configuration with a second avalanche diode (105) in series with a second rectifier diode (106) also connected cathode to cathode. All the diodes of the TVS device are on a single semiconductor substrate (301). The die has a low resistivity buried diffused layer (303) having a first conductivity type disposed between a semiconductor substrate (301) having the opposite conductivity type and a high resistivity epitaxial layer (305) having the first conductivity type. The buried diffused layer shunts most of a transient current away from a portion of the epitaxial layer between the first avalanche diode and the first rectifier diode, thereby reducing the clamping voltage relative to the breakdown voltage. The TVS device is packaged as a flip chip (202) that has four solder bump pads (211–214). The abstract is submitted with the understanding that it will not be used to interpret or limit the scope or meaning of the claims pursuant to 37 C.F.R. §1.72(b).

1 Claim, 6 Drawing Sheets

TRANSIENT VOLTAGE SUPPRESSION DEVICE

BACKGROUND OF THE INVENTION

1. Field of the Invention

This invention relates generally to active solid-state devices, and more particularly to a transient voltage suppression device having one or more avalanche diodes.

2. Description of the Related Art

Transient voltage suppression ("TVS") devices comprising an avalanche diode are well known. As the reverse avalanche voltage is made smaller, a depletion region of the avalanche diode narrows, resulting in a higher internal capacitance of the avalanche diode. As operating frequencies become higher, the internal capacitance of the avalanche diode becomes problematic. A known solution to the capacitance problem is to add a rectifier diode in series with the avalanche diode, with either the anodes or the cathodes of the diodes connected together. A rectifier diode has a smaller capacitance than an avalanche diode, and the total capacitance of a pair of such diodes in series is less than the sum of the two capacitances.

TVS devices having both diodes of such pair on a single die are also known. For example, U.S. Pat. No. 6,392,266 entitled TRANSIENT SUPPRESSING DEVICE AND METHOD, issued May 21, 2002, to Robb et al., discloses two transient voltage suppressors that are housed in a single semiconductor package, each transient voltage suppressor comprising two serially coupled diodes on one die. A TVS device comprising such a pair of diodes is a unidirectional device in that the TVS device provides protection against voltage spikes or surges in one direction only.

Bi-directional TVS devices comprising two such pairs of diodes in an anti-parallel configuration are also known. Known bi-directional TVS devices comprise at least two die, wire bonded together inside a single semiconductor package. One example of such a TVS device is the Model No. PSLC03 thru PSLC24C family of TVS devices manufactured by ProTek Devices of Phoenix, Ariz., which includes four die inside a single semiconductor package. Such TVS devices work well for their intended uses, but when a very small bi-directional TVS device is required, a TVS device comprising a single die is preferred.

The reverse avalanche voltage, or breakdown voltage, is defined as the voltage at which the avalanche diode goes into avalanche mode, measured at a relatively low current such as one milliamp. The breakdown voltage is controlled by the doping level of an N+ diffusion layer relative to the doping level of a P+ diffusion layer of the avalanche diode. The clamping voltage is defined as the maximum voltage across the TVS device when a maximum surge current is flowing through it. The clamping voltage is typically measured at a relatively high current such as one amp. As a result, the clamping voltage is normally higher than the breakdown voltage. The clamping voltage of a TVS device is directly, although not necessarily linearly, proportional to the breakdown voltage of the avalanche diode. The amount by which the clamping voltage is greater than the breakdown voltage is directly proportional to the geometry of the PN junction and to the diffusion depth of the avalanche diode. A higher background resistivity of a doped epitaxial region of the die results in a higher clamping voltage relative to the breakdown voltage.

As electronic devices, especially battery-operated portable electronic devices such as cellular telephones become smaller, there is a need for a smaller TVS device. It is desirable that a TVS device have as low a clamping voltage as possible. When the TVS device reaches its clamping voltage, the TVS device prevents the electronic device under protection from exposure to any higher voltage than the clamping voltage. The clamping voltage of a prior art TVS device would disadvantageously rise if the avalanche diode were simply made smaller because a smaller PN junction area has a higher resistance.

OBJECTS OF THE INVENTION

It is therefore an object of the present invention to provide a flip chip that overcomes the disadvantages of the prior art, and in particular, to provide a flip chip that includes a transient voltage suppression device that has a low clamping voltage.

These and other objects of the present invention will become apparent to those skilled in the art as the description thereof proceeds.

SUMMARY OF THE INVENTION

Briefly described, and in accordance with a preferred embodiment thereof, the present invention relates to a flip chip that includes a transient voltage suppression device. The transient voltage suppression device includes a semiconductor die that includes a substrate diffused with a material to give the substrate a first conductivity type. The substrate has a substrate surface. A buried layer is selectively formed in the substrate surface and is diffused with another material to give the buried layer a second conductivity type. An epitaxial layer is formed on the substrate surface and on the buried layer. The epitaxial layer has the second conductivity type. The epitaxial layer has an epitaxial surface distal from the substrate surface. A first diffused region is selectively formed on the epitaxial surface. The first diffused region has the second conductivity type. The first diffused region has a first surface distal from the substrate surface. A second diffused region is selectively formed on the first surface. The second diffused region has the first conductivity type. The first diffused region and the second diffused region combine to form a first semiconductor junction. A third diffused region is selectively formed on the epitaxial surface remote from the first diffused region. The third diffused region has the first conductivity type. The epitaxial layer and the third diffused region combine to form a second semiconductor junction. A first aluminum region is disposed on the second surface and a second aluminum region is disposed on the third surface. Two solder bump pads are at the first aluminum region and two solder bump pads are at the second aluminum region. The two solder bump pads at the first aluminum region are electrically coupled to the second diffused region and the two solder bump pads at the second aluminum region are electrically coupled to the third diffused region. The first semiconductor junction operates in a reverse avalanche mode while the second semiconductor junction operates in a forward conducting mode during a transient over-voltage event, and a transient current is shunted through the buried layer during the transient over-voltage event.

Other aspects, features and advantages of the present invention will become apparent to those skilled in the art from the following detailed description and the accompanying drawings.

BRIEF DESCRIPTION OF THE DRAWINGS

The present invention will be described with greater specificity and clarity with reference to the following drawings, in which.

Figure 1:
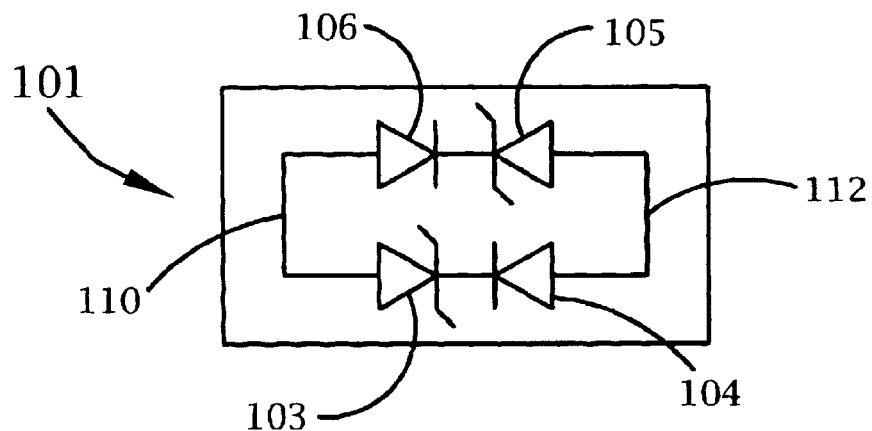
FIG. 1 is a schematic electrical diagram of a TVS device in accordance with the invention.

For simplicity and clarity of illustration, the drawing figures illustrate the general manner of construction, and descriptions and details of well-known features and techniques are omitted to avoid unnecessarily obscuring the invention. Furthermore, elements in the drawing figures are not necessarily drawn to scale.

DESCRIPTION OF THE PREFERRED EMBODIMENT

The embodiments discussed below are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality, e.g., one die, two die. The terms first, second, and the like, in the description and in the claims, if any, are used for distinguishing between similar elements and not necessarily for describing a sequential or chronological order. The terms top, front, side, and the like, in the description and in the claims, if any, are used for descriptive purposes and not necessarily for describing relative positions.

FIG. 1 is a schematic electrical diagram of a TVS device 101 in accordance with the invention. The TVS device 101 comprises a first avalanche diode 103 in series with a first rectifier diode 104 connected cathode to cathode ("first pair"), electrically coupled in an anti-parallel configuration with a second avalanche diode 105 in series with a second rectifier diode 106 also connected cathode to cathode ("second pair"). The anode of the first avalanche diode 103 and the anode of the second rectifier diode 106 are connected to a same first node 110. The anode of the first rectifier diode 104 and the anode of the second avalanche diode 105 are connected to a same second node 112. In a typical use of the TVS device 101 in a common mode configuration, the first node 110 is connected to a line, and the second node 112 is connected to a ground. However, the TVS device 101 is symmetrical, and the first node 110 and the second node 112 are interchangeable.

The TVS device 101 in accordance with the invention is a bi-directional device in that the TVS device provides protection against voltage transients, spikes and surges in both directions. During normal operation, voltage swings are lower than the breakdown voltage of the avalanche diodes 103 and 105; therefore, current does not flow through the TVS device 101. If a negative transient signal occurs that is greater than the breakdown voltage, the first avalanche diode 103 breaks down, thereby routing a surge current, through both the first avalanche diode 103 operating in an avalanche mode and the first rectifier diode 104 operating in a forward conducting mode, to ground. Concurrently, the second rectifier diode 106 operates in a rectifying mode. If a positive transient signal occurs that is greater than the breakdown voltage, the second avalanche diode 105 breaks down, thereby routing a surge current, through both the second avalanche diode 105 operating in the avalanche mode and the second rectifier diode 106 operating in the forward conducting mode, to ground. Concurrently, the first rectifier diode 104 operates in the rectifying mode. As a result, the voltage is limited to the clamping voltage of the TVS device 101.

When no transient signal is present, the TVS device 101 produces a load with a high impedance at its intended operating frequency, as a result of the low capacitance of the rectifier diodes 104 and 106. The capacitance of the TVS device 101 in accordance with the invention is less than approximately 10 pF. The intended operating frequency of the TVS device 101 is approximately 500 MHz. The clamping voltage of the TVS device 101 is preselected to be in the range of approximately 8–30 volts.

Figure 2:
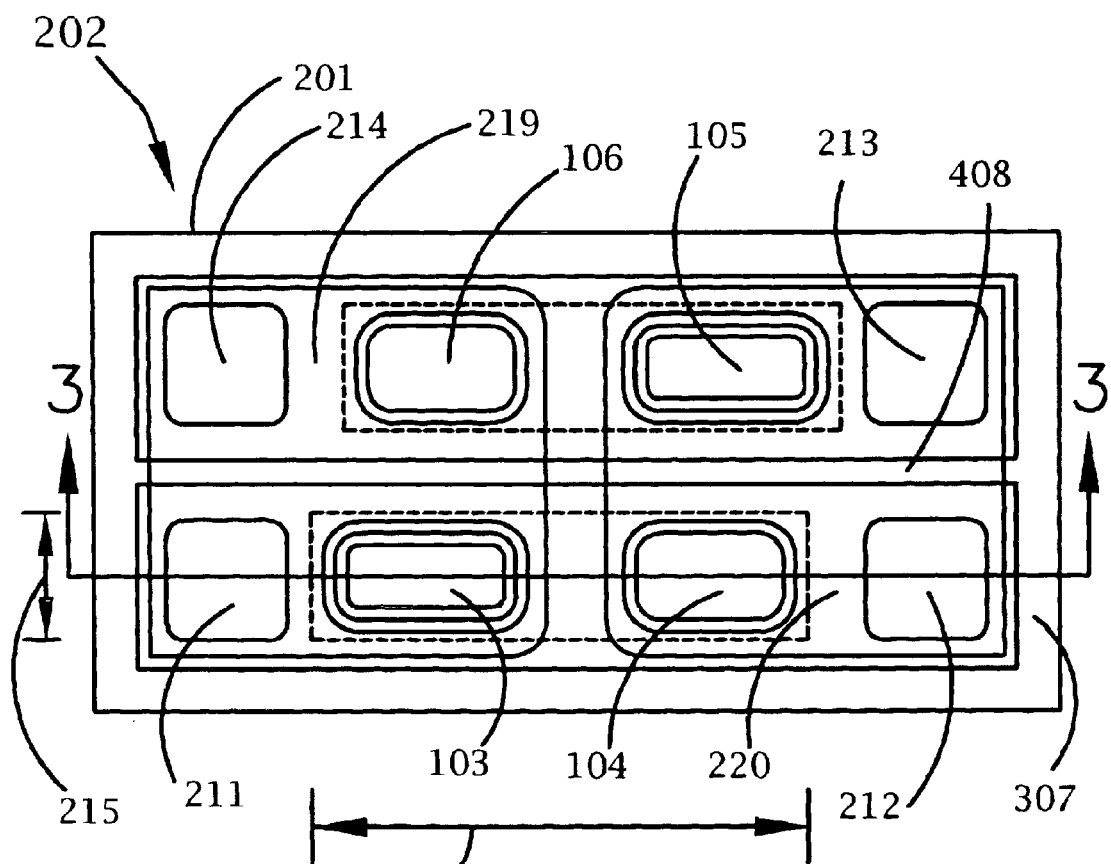
FIG. 2 is a simplified plan view of a semiconductor die of the TVS device in accordance with the invention.

FIG. 2 is a simplified plan view of the TVS device 101 in accordance with the invention. The TVS device 101 comprises one monolithic semiconductor die, or die, 201. The one die 201 comprises the first avalanche diode 103 in series with the first rectifier diode 104 connected cathode to cathode, electrically coupled in anti-parallel configuration with the second avalanche diode 105 in series with the second rectifier diode 106 also connected cathode to cathode. Preferably, the TVS device 101 is packaged as a flip chip 202. The flip chip 202 has four solder bump pads 211–214. Solder bump pads 211 and 214 are electrically coupled to the first node 110, and solder bump pads 212 and 213 are electrically coupled to the second node 112. A solder bump (not shown) is placed at each solder bump pad 211–214. Only one of the solder bump pads 211 and 214 at the first node 110, and only one of the solder bump pads 212 and 213 at the second node 112 are required for electrical operation because the TVS device 101 is a two terminal device. However, a solder bump is placed at each of the four solder bump pads 211–214 for mechanical stability.

Figure 3:
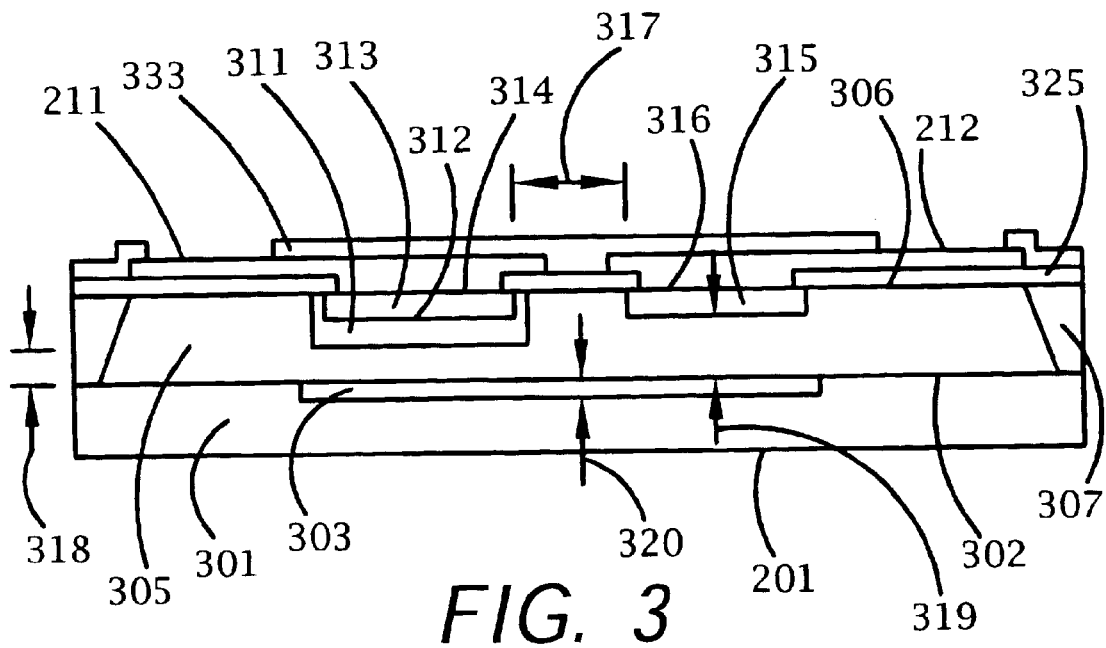
FIG. 3 is a simplified cross-sectional view of the semiconductor die of FIG. 2 through cut line 3—3.

FIG. 3 is a simplified cross-sectional view of the die 201 through cut line 3—3. The die 201 comprises a P+ semiconductor substrate, or substrate, 301. The P+substrate 301 has a substrate surface 302. An N+ buried layer 303 is disposed on a portion of the substrate surface 302. An N-type epitaxial ("N-EPI") layer 305 is grown on the substrate surface 302, including over the portion of the substrate surface having the N+ buried layer 303. The N-EPI layer 305 has an epitaxial surface 306 distal from the substrate surface. There is a P+ isolation diffusion region 307 around the perimeter region of the die 201. This perimeter region prevents an increase in leakage current that might occur as a result of damage to the edges of the die 201 that usually occurs when the die is separated from its wafer. The leakage current might cause the die to test "bad", and might cause some undesirable interaction between the first pair and the second pair. A portion 408 (see FIG. 4) of the P+ isolation diffusion region 307 extends between the first pair and the second pair. The portion 408 isolates the first pair from the second pair. The portion 408 of the P+ isolation diffusion region 307 electrically isolates the two anti-parallel circuits on the die 201, and allows the two anti-parallel circuits to be on one die without interfering with one another.

A heavily doped, N+ first diffused region 311 is disposed on the epitaxial surface 306 of the N-EPI layer 305. The N+ first diffused region 311 is the cathode of the first avalanche diode 103. The N+ first diffused region 311 has a first surface 312 distal from the substrate surface 302. A P+ second diffused region 313 is disposed on the first surface 312 of the N+ first diffused region 311. The P+ second diffused region 313 is the anode of the first avalanche diode 103. The P+ second diffused region 313 has a second surface 314 distal from the substrate surface 302. The first avalanche diode 103 is formed by a PN, or semiconductor, junction between the N+first diffused region 311 and the P+ second diffused region 313 of die 201.

A P+ third diffused region 315 is disposed on the epitaxial surface 306 of the N-EPI layer 305. The P+ third diffused region 315 is the anode of the first rectifier diode 104. The P+ third diffused region 315 has a third surface 316 distal from the substrate surface 302. The first rectifier diode 104 is formed by a semiconductor junction between the N-EPI layer 305 and the P+ third diffused region 315 of the die 201. The second avalanche diode 105 and the second rectifier diode 106 of the second pair are similar to the first avalanche diode 103 and the first rectifier diode 104 of the first pair, respectively, and, therefore, are not described in detail.

During a transient over-voltage event, the N+ buried layer 303 reduces the clamping voltage of the TVS device 101. The clamping voltage is controlled by the geometry and doping of the N+ buried layer 303. Referring back to FIG. 2, the N+ buried layer 303 has a length 215 and a width 216. The N+ buried layer 303 advantageously reduces the clamping resistance of the TVS device 101 when the TVS device is in an avalanche mode. The clamping voltage of the TVS device 101 in accordance with the invention is improved, i.e., lowered, by about 20% over prior art TVS devices. For example, a typical prior art TVS device has a clamping voltage of 9.5 volts, whereas, the TVS device 101 in accordance with the invention has a clamping voltage of only 7.6 volts.

The N-EPI layer 305 on the silicon P+ substrate 301 is a high resistivity (approximately 70 ohm-cm) N-type material. The resistivity of the N+ buried layer 303 is an order of magnitude lower than the resistivity of the N-EPI layer 305. The doping levels and the thickness of the layers obtained through diffusion and the lateral dimensions for each element are well known to a person skilled in the art of semiconductors. The high resistivity of the N-EPI layer 305 is needed to produce a high reverse voltage for the rectifier diodes 104 and 106. The high reverse voltage for the rectifier diodes 104 and 106 is needed so that the first rectifier diode 104 of the first pair is not in avalanche mode when the second pair is conducting during a transient event, and vice versa.

Referring again to FIG. 3, the N-EPI layer 305 forms a high resistivity conduction path between the first avalanche diode 103 and the first rectifier diode 104 for conducting the surge current during a voltage surge. A distance 317 between the first avalanche diode 103 and the first rectifier diode 104 is approximately 150 µm. In a prior art TVS device lacking the N+ buried layer 303, a surge current would travel the distance 317 between the first avalanche diode 103 and the first rectifier diode 104 through the high resistivity N-EPI layer 305. In a prior art TVS device, the relatively long distance 317 would cause a large voltage drop between the first avalanche diode 103 and the first rectifier diode 104 when the first avalanche diode is in avalanche mode and conduction occurs between the first avalanche diode and the first rectifier diode. A distance 318 between the first avalanche diode 103 and the N+ buried layer 303 is approximately 10 µm. A distance 319 between the first rectifier diode 104 and the N+ buried layer 303 is approximately 15 µm.

With the N+ buried layer 303 in accordance with the invention, the surge current goes through the N+ buried layer 303 rather than going solely through the N-EPI layer 305 because of the much lower resistivity of the N+ buried layer relative to the N-EPI layer. The N+ buried layer 303 reduces the effective length of the high resistivity conduction path (through the N-EPI layer 305) from about 150 µm to about 25 µm, thereby reducing the resistance seen by the surge current, and consequently reducing the clamping voltage relative to the breakdown voltage. The N+ buried layer 303 significantly reduces the voltage drop between the first avalanche diode diffusion area and the first rectifier diode diffusion area. Advantageously, the N+ buried layer 303 shunts most of the surge current away from the portion of the high resistivity N-EPI layer 305 between the first avalanche diode 103 and the first rectifier diode 104. The N+ buried layer 303 acts as a low resistance region for conduction between the first avalanche diode 103 and the first rectifier diode 104. Without the N+ buried layer 303, the clamping voltage is higher and the possibility of damaging electronics beyond the TVS device 101 is greater. Advantageously, the N+ buried layer 303 does not increase the capacitance of the TVS device 101. The N+ buried layer 303 has no effect on the breakdown voltage of the first avalanche diode 103, and, at low currents, has no effect on the forward bias voltage of the first rectifier diode 104. The operation of the second pair is similar to the operation of the first pair, and, therefore, is not described in detail.

Although the N+ buried layer 303 advantageously reduces the clamping voltage relative to the breakdown voltage, the N+ buried layer has no effect on the breakdown voltage itself. For example, the breakdown voltage of the avalanche diodes 103 and 105 in accordance with the invention is approximately seven (7) volts; whereas, the clamping voltage of the avalanche diodes is advantageously only slightly higher at approximately eight (8) volts.

Figure 4:
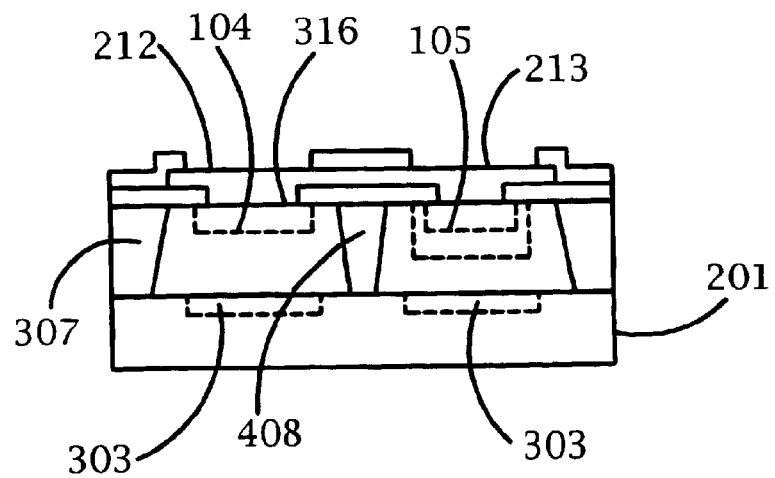
FIG. 4 is a simplified right side view of the semiconductor die of FIG. 2.

FIG. 4 is a simplified right side view of the die 201.

Figure 5:
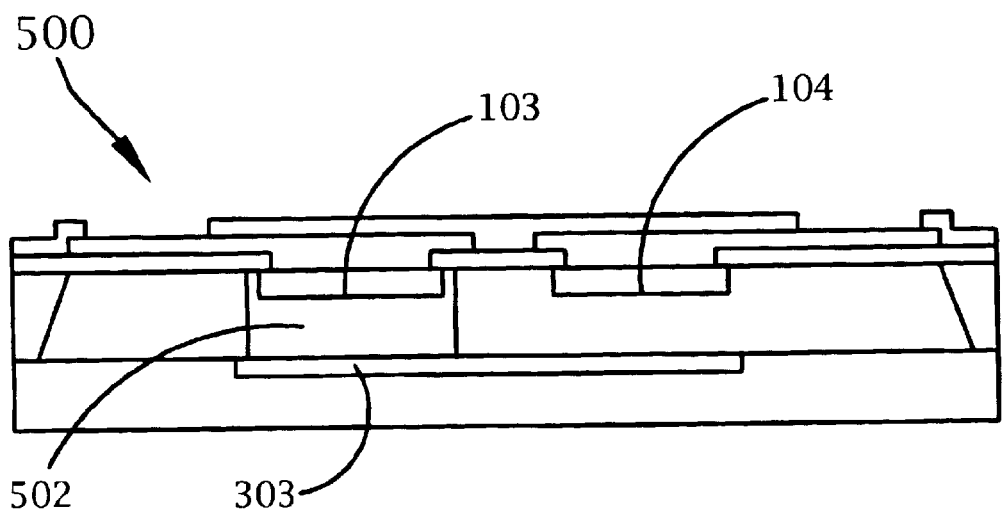
FIG. 5 is a simplified cross-sectional view of an alternate embodiment of the semiconductor die of FIG. 2 through cut line 3—3.
Figure 6:
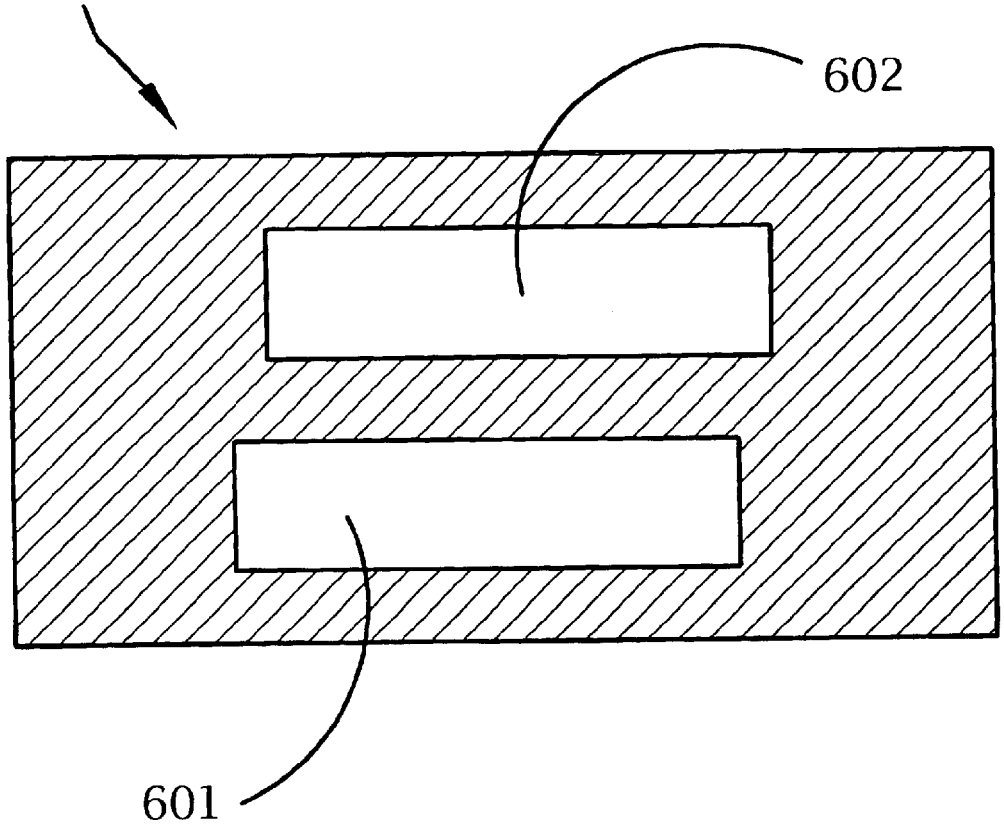
FIGS. 6–12 are simplified representations of masks used to manufacture the TVS device in accordance with the invention.
Figure 7:
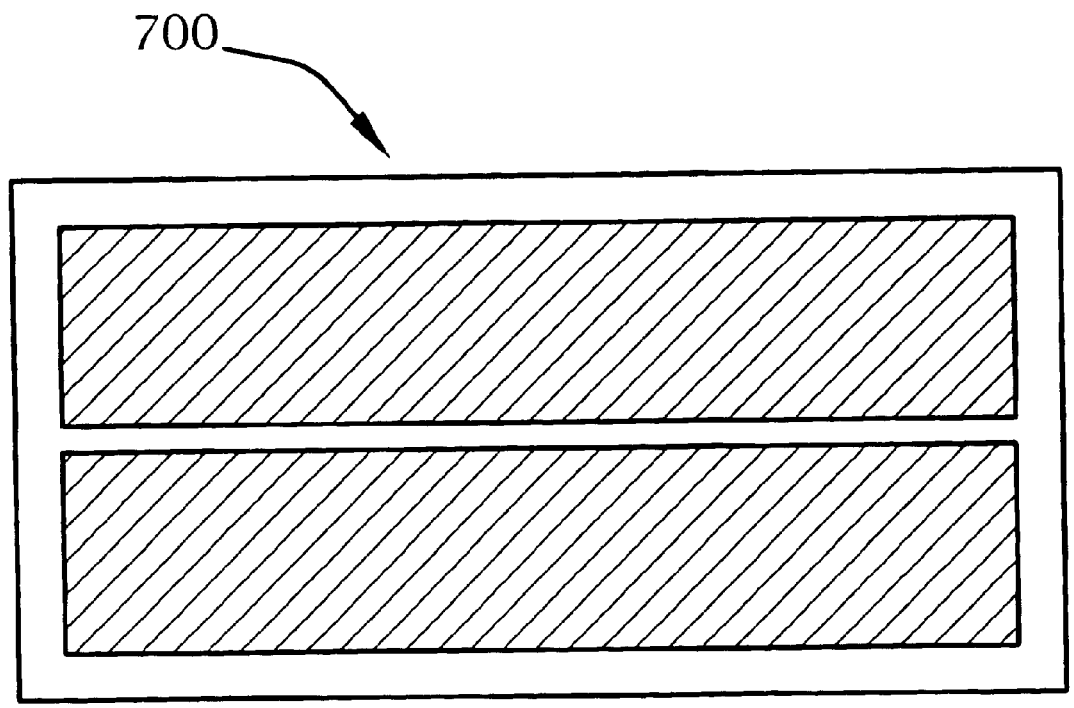
Figure 8:
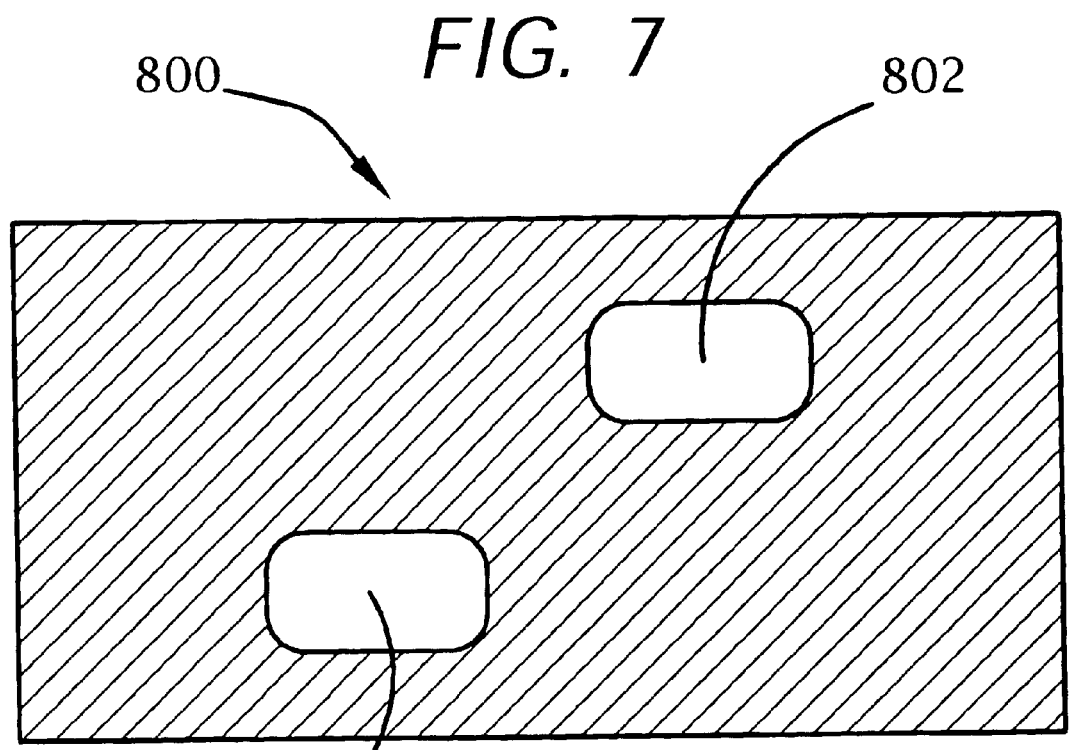
Figure 9:
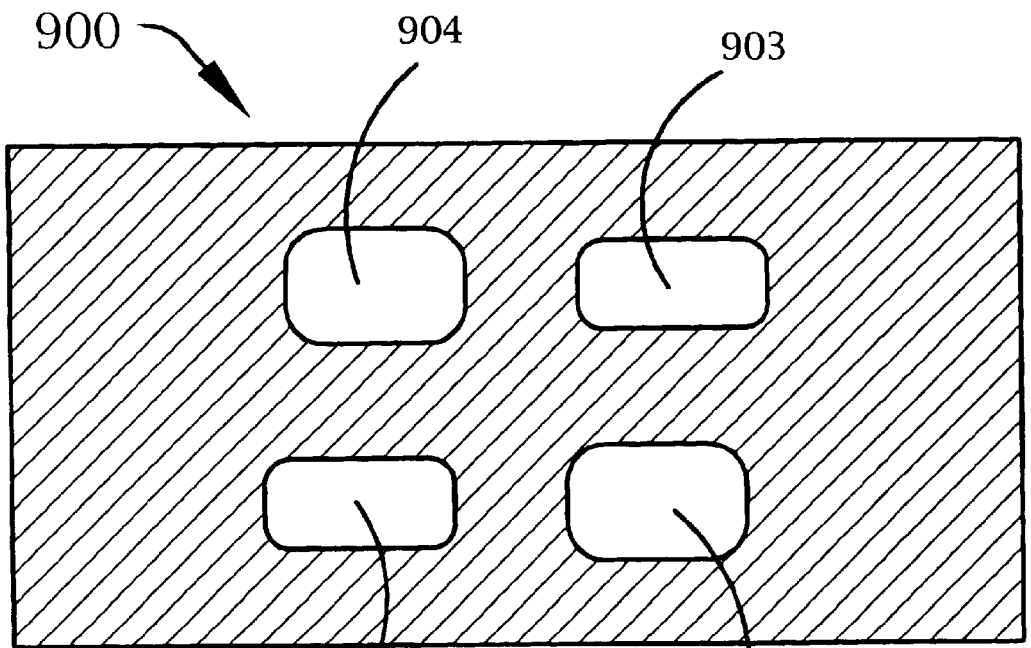
Figure 10:
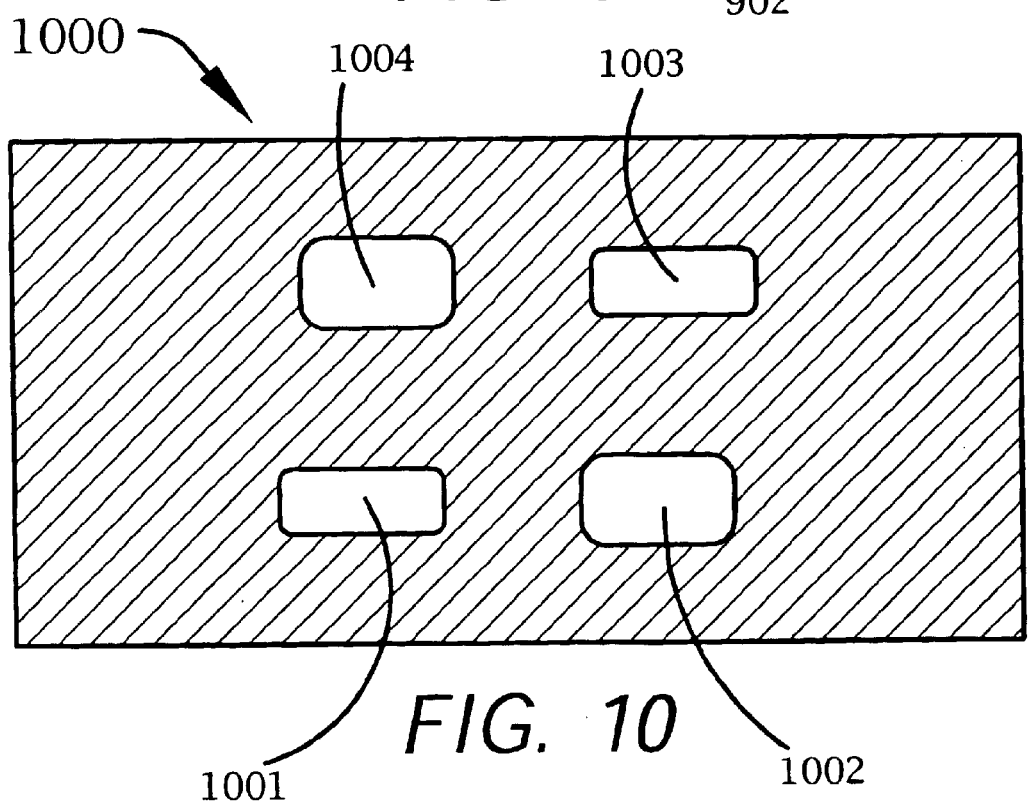
Figure 11:
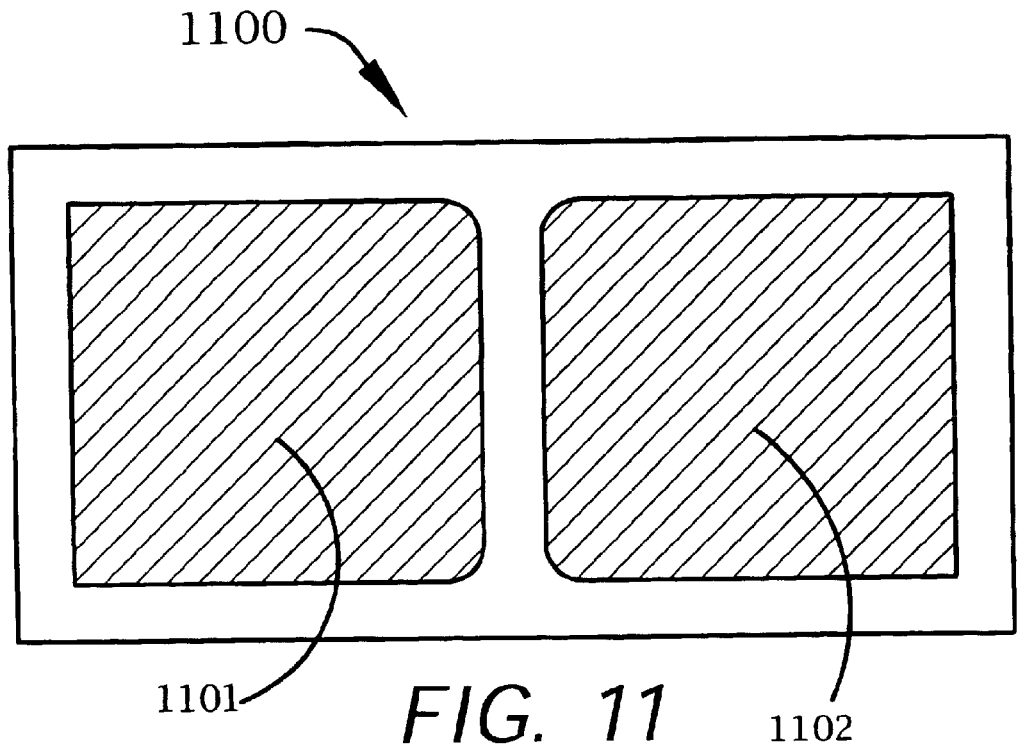
Figure 12:
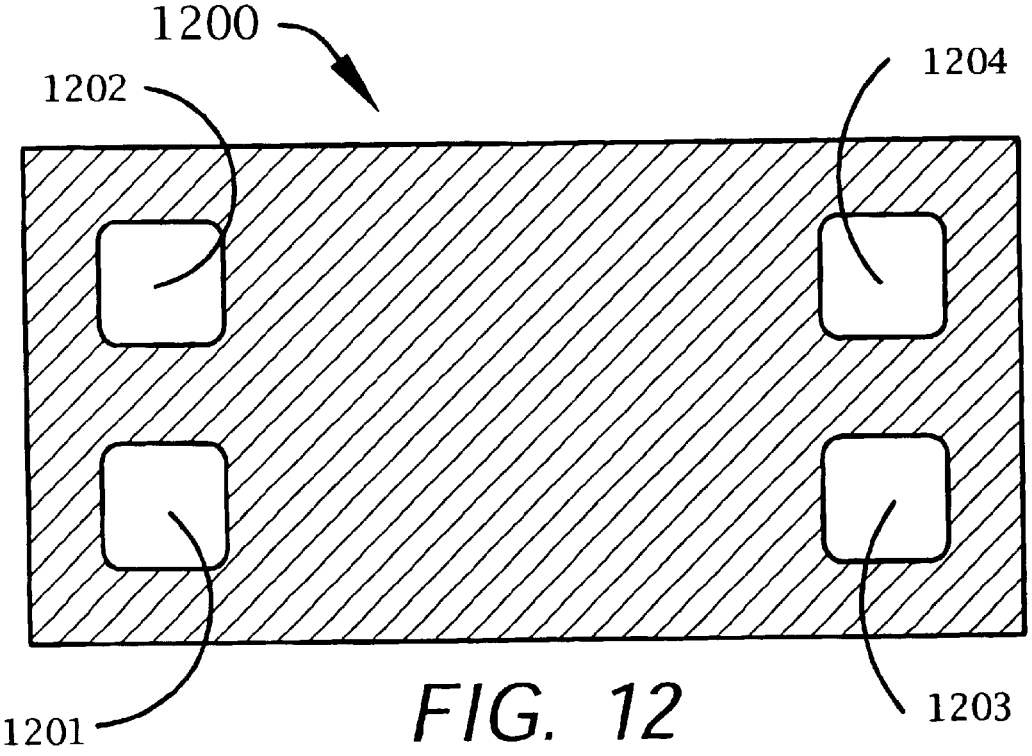

FIG. 5 is a simplified cross-sectional view of an alternate embodiment 500 of the die 201 through cut line 3—3, showing a larger N+ first diffused region 502 of the first avalanche diode 103. The larger N+ first diffused region 502 extends to the N+buried layer 303. Although the alternative embodiment 500 takes longer to manufacture because a much longer N+ diffusion time is required, the advantage of the alternate embodiment is a further reduction of the clamping voltage relative to the breakdown voltage.

FIGS. 6–12 are simplified representations of masks 600–1200 used to manufacture the TVS device 101 in accordance with the invention. A method of manufacturing a small, low capacitance flip chip 202 that has bi-directional transient voltage protection and a low clamping voltage, comprises the following steps:

(1) start with the P+ substrate 301. It should be noted that the P+ substrate 301 is semiconductor material with a very high doping level for reduced resistivity, and is different from the P-type material of the PN junction.

(2) Grow a thermally deposited diffusion oxide 325, preferably $SiO_2$, on the P+ substrate 301 and pattern the oxide in the shape of mask A 600, to open two windows 601 and 602 for N+ diffusion. The larger the area of the two windows 601 and 602 in mask A 600, the lower is the resistance of the two avalanche diodes 103 and 105.

(3) Perform N+ diffusion to a depth 320 of approximately five (5) µm at the portions of the P+ substrate exposed by the two windows 601 and 602. Upon completion of this N+ diffusion, the N+ buried layer 303 in accordance with the invention is formed. The greater the depth of the N+ buried layer 303, the lower is the resistance. The higher the doping level of the N+ buried layer 303, the lower is the resistance. The doping level is controlled by temperature, diffusion time and concentration of dopant on the surface.

(4) Remove the thermally grown diffusion oxide that was grown in step two.

(5) Grow a high resistivity N-EPI layer 305 of approximately 25 µm thickness on the same side of the P+ substrate 301 that was subjected to the N+ diffusion of step two.

(6) Grow a diffusion oxide on the N-EPI layer and pattern the oxide in the shape of mask B 700 for P+ diffusion.

(7) Perform P+ diffusion on the portions of the N-EPI layer 305 exposed by mask B, such that the diffusion penetrates to the P+ substrate 301. Upon completion of the diffusion, these portions become the P+ isolation diffusion region 307 and 408.

(8) Apply mask C over the existing diffusion oxide. Mask C 800 has two windows 801 and 802. The larger the area of these windows 801 and 802, the greater is the current-carrying capability of the resulting avalanche diodes 103 and 105.

(9) Diffuse the N+ regions in the N-EPI layer 305 to form the N+ first diffused region 311 of the TVS device 101. The N+ first diffused region 311 is used to fix the breakdown voltage of the TVS device 101. The depth of the N+ first diffused region 311 is selected to produce a preselected breakdown voltage. A greater depth results in a higher breakdown voltage, which, in turn, results in a higher clamping voltage. At the same time, re-grow the thermally deposited diffusion oxide 325 and apply mask D 900 over the diffusion oxide. Mask D 900 has four windows 901–904.

(10) Diffuse the P+ second diffused region 313 and P+ third diffused region 315 in both the N+ first diffused region 311 and in a region in the N-EPI layer 305 over the N+ buried layer 303 and adjacent to, but not in contact with, the N+ first diffused region. The P+ diffusion of this step is selected such that the breakdown voltage will be controlled to a given specification in the N+ first diffused region 311. The P+ third diffused region 315 (anode) on the N-EPI layer and the N-EPI layer 305 (cathode) form the first rectifier diode junction. The high resistivity of the N-EPI layer 305 and the small size of the junction of the first rectifier diode 104 are preselected to provide a specific low value of junction capacitance. The P+ second diffused region 313 (anode) on the N+ first diffused region 311, and the diffused N+ first region (cathode) form a first avalanche diode junction. The high doping level (and low resistivity) of the N+ first diffused region 311, which is required for the desired avalanche breakdown voltage, results in a high internal capacitance of the first avalanche diode 103. At the same time, re-grow the thermally deposited diffusion oxide 325 and apply mask E 1000 over the oxide. Mask E 1000 has four windows 1001–1004.

(11) Apply an aluminum metalization layer 327 to the entire top surface of the die 201 distal from the substrate surface 302 to provide a first external electrical contact to the second surface 314 of the P+ second diffused region 313, and a second external electrical contact to the third surface 316 of the P+ third diffused region 315, where exposed by windows 1001–1004 of mask E 1000.

(12) Using mask F 1100, remove the aluminum metalization layer 327 except for portions 1101 and 1102 to form first and second aluminum regions 219 and 220 (see FIG. 2) at each end of the die 201, which electrically couple the anode of the first avalanche diode 103 to the anode of the second the rectifier diode 106 and the anode of the first rectifier diode 104 to the anode of the second the avalanche diode 105, respectively. The aluminum region 219 also electrically couples the external electrical contact at the second surface 314 to solder bump pads 211 and 214. The aluminum region 220 also electrically couples the external electrical contact at the third surface 316 to solder bump pads 212 and 213.

(13) Apply a low temperature, chemically vapor deposited ("CVD") $SiO_2$ layer 333 over the entire surface of the die 201 as a passivation layer. Alternatively, a nitride or another oxide is used as the passivation layer.

(14) Apply mask G 1200, and pattern the CVD $SiO_2$ layer 333 such that two windows 1201–1202 and 1203–1204 are opened in the CVD $SiO_2$ layer to the aluminum metalization layer 327 at each end of the die 201.

(15) Apply underbump metallurgy in the open windows comprising nickel with a flash of gold as a passivant on the nickel surface.

(16) Screen print a solder paste over the underbump metallurgy and reflow the solder to construct the solder bumps.

The description of the method of manufacturing refers primarily to the first avalanche diode 103 and the first rectifier diode 104, i.e., the first pair, for succinctness; however, the description also applies to the second pair.

The TVS device 101 and the flip chip 202 have the small dimensions of 0.02 inch width by 0.04 inch length by 0.02 inch height, and have a low clamping voltage of 8–30 volts and a low capacitance of 10 pF or less. The clamping voltage and the capacitance of the TVS device 101 and the flip chip 202 are improvements over prior art TVS devices and flip chips of similar physical dimensions. Known prior art TVS devices and flip chips of similar physical dimensions have a clamping voltage of 9–36 volts and a capacitance of 30 pF.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

| LIST OF REFERENCE NUMERALS | |
|---|---|
| 101 | Transient Voltage Suppression ("TVS") Device |
| 103 | First Avalanche Diode |
| 104 | First Rectifier Diode |
| 105 | Second Avalanche Diode |
| 106 | Second Rectifier Diode |
| 110 | First Node |
| 112 | Second Node |
| 201 | Semiconductor Die, or Die |
| 202 | Flip Chip |
| 211–214 | Solder Bump Pads |
| 215 | Length |
| 216 | Width |
| 219–220 | Aluminum Regions |
| 301 | P+ Semiconductor Substrate, or Substrate |
| 302 | Substrate Surface |
| 303 | N+ Buried Layer |
| 305 | N-Type Epitaxial ("N-EPI") Layer |
| 306 | Epitaxial Surface |
| 307 | P+ Isolation Diffusion Region |
| 311 | N+ First Diffused Region |
| 312 | First Surface |

-continued

LIST OF REFERENCE NUMERALS

| | |
|---|---|
| 313 | P+ Second Diffused Region |
| 314 | Second Surface |
| 315 | P+ Third Diffused Region |
| 316 | Third Surface |
| 317 | Distance |
| 318 | Distance |
| 319 | Distance |
| 320 | Depth |
| 325 | Thermally Deposited Diffusion Oxide |
| 333 | Chemically Vapor Deposited ("CVD") SiO$_2$ Layer |
| 408 | Portion of the P+ Isolation Diffusion Region |
| 500 | Alternate Embodiment of the TVS Device |
| 502 | Larger N+ First Diffused Region |
| 600 | Mask A |
| 601–602 | Windows |
| 700 | Mask B |
| 800 | Mask C |
| 801–802 | Windows |
| 900 | Mask D |
| 901–904 | Windows |
| 1000 | Mask E |
| 1001–1004 | Windows |
| 1100 | Mask F |
| 1101–1102 | Portions |
| 1200 | Mask G |
| 1201–1204 | Windows |

We claim:

1. A flip chip, comprising:

a transient voltage suppression device including a semiconductor die, the semiconductor die including (a) a semiconductor substrate diffused with a first material to give the substrate a first conductivity type, the substrate having a substrate surface;

(b) a buried layer selectively formed in the substrate surface and diffused with a second material to give the buried layer the opposite conductivity type as the substrate;

(c) an epitaxial layer formed on the substrate surface and on the buried layer, the epitaxial layer having the opposite conductivity type as the substrate, the epitaxial layer having an epitaxial surface distal from the substrate surface, the epitaxial layer having a higher resistivity than the resistivity of the buried layer;

(d) a first diffused region selectively formed on the epitaxial surface, the first diffused region having the same conductivity type as the epitaxial layer, the first diffused region having a first surface distal from the substrate surface;

(e) a second diffused region selectively formed on the first surface, the second diffused region having a second surface distal from the substrate surface, the second diffused region having the opposite conductivity type as the first diffused region, the first diffused region and the second diffused region forming a first semiconductor junction; and (f) a third diffused region selectively formed on the epitaxial surface remote from the first diffused region, the third diffused region having a third surface distal from the substrate surface, the third diffused region having the opposite conductivity type as the epitaxial layer, the epitaxial layer and the third diffused region forming a second semiconductor junction, the second surface and the third surface providing first and second external electrical contacts for the transient voltage suppression device; and (g) a first aluminum region disposed on the second surface and a second aluminum region disposed on the third surface, including two solder bump pads at the first aluminum region and two solder bump pads at the second aluminum region, in which the two solder bump pads at the first aluminum region are electrically coupled to the second diffused region and the two solder bump pads at the second aluminum region are electrically coupled to the third diffused region, wherein the first semiconductor junction operates in a reverse avalanche mode while the second semiconductor junction operates in a forward conducting mode during a transient over-voltage event, and a transient current is shunted through the buried layer during the transient over-voltage event.

* * * * *